United States Patent
Kang et al.

(10) Patent No.: US 7,485,955 B2
(45) Date of Patent: Feb. 3, 2009

(54) SEMICONDUCTOR PACKAGE HAVING STEP TYPE DIE AND METHOD FOR MANUFACTURING THE SAME

(75) Inventors: In-Ku Kang, Cheonan (KR); Seok Goh, Cheonan (KR); Jin-Ho Kim, Cheonan (KR); Tae-Gyeong Chung, Suwon (KR); Yong-Jae Lee, Seongnam (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 369 days.

(21) Appl. No.: 11/077,235

(22) Filed: Mar. 11, 2005

(65) Prior Publication Data

US 2005/0205975 A1    Sep. 22, 2005

Related U.S. Application Data

(63) Continuation-in-part of application No. 10/805,212, filed on Mar. 22, 2004, now abandoned.

(30) Foreign Application Priority Data

Apr. 1, 2004 (KR) .................... 10-2004-0022666

(51) Int. Cl.
*H01L 23/12* (2006.01)
*H01L 23/053* (2006.01)

(52) U.S. Cl. ...................... 257/701; 257/686
(58) Field of Classification Search ............ 257/701, 257/686
See application file for complete search history.

(56) References Cited

U.S. PATENT DOCUMENTS

| | | | |
|---|---|---|---|
| 3,538,400 A | 11/1970 | Yanai et al. | |
| 3,816,906 A | 6/1974 | Falckenberg | |
| 5,323,060 A | 6/1994 | Fogal et al. | |
| 5,793,108 A | 8/1998 | Nakanishi et al. | |
| 6,359,340 B1 | 3/2002 | Lin et al. | |
| 2002/0125556 A1 | 9/2002 | Oh et al. | |

(Continued)

FOREIGN PATENT DOCUMENTS

DE    4308705    9/1993

(Continued)

OTHER PUBLICATIONS

Office Action dated Jul. 20, 2007 for corresponding German Patent Application No. 10 2005 016 439.0-33.

*Primary Examiner*—David A Zarneke
(74) *Attorney, Agent, or Firm*—Harness, Dickey & Pierce PLC

(57) ABSTRACT

A variety of non-rectangular IC chips having a stepped or modified periphery or edge profile including one or more recessed or indented peripheral regions are provided for incorporation in modified package configurations, single chip packages and multi-chip assemblies, both stacked and/or planar. In the planar configurations, the recessed regions may be utilized, in cooperation with another appropriately sized IC chip, to increase the packing density of the resulting device. Similarly, in the stacked configuration, the recessed regions may be utilized to provide access to bond pads of lower chips and thereby reduce the need for spacers or peripheral thinning techniques and thereby improve the strength of the resulting assembly and/or reduce the overall height of the stacked structure.

6 Claims, 18 Drawing Sheets

U.S. PATENT DOCUMENTS

| | | |
|---|---|---|
| 2003/0001281 A1 | 1/2003 | Kwon et al. |
| 2003/0102567 A1 | 6/2003 | Eskildsen |
| 2003/0178710 A1 | 9/2003 | Kang et al. |

FOREIGN PATENT DOCUMENTS

| | | |
|---|---|---|
| JP | 61093613 | 5/1986 |
| JP | 2000-049279 | 2/2000 |
| JP | 2000-058742 | 2/2000 |
| JP | 2000-306865 | 11/2000 |
| JP | 2001-196526 | 7/2001 |
| KR | 1998-067184 | 10/1998 |
| KR | 1998-084225 | 12/1998 |
| KR | 2003-0002476 | 1/2003 |

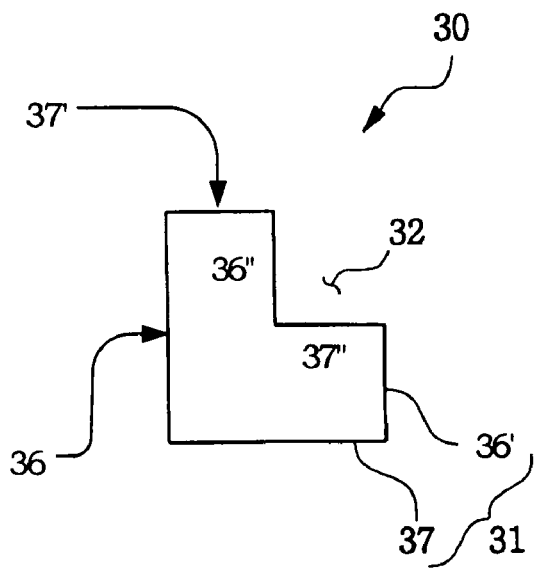
FIG. 8
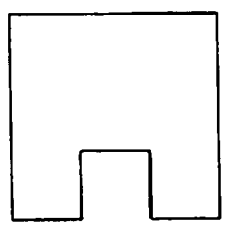 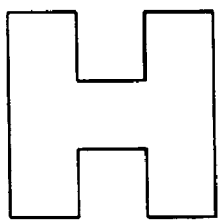 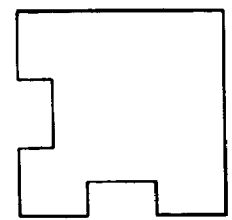 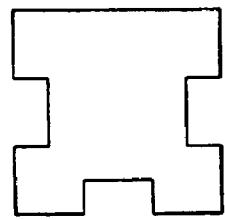
(a)      (b)      (c)      (d)
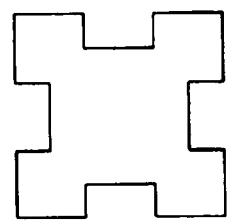 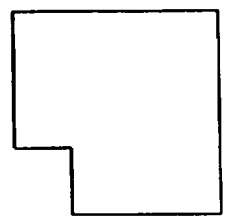 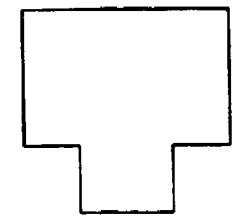 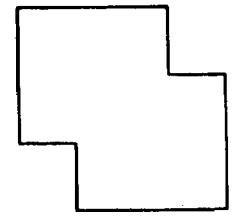
(e)      (f)      (g)      (h)
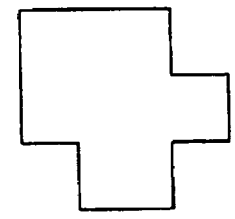 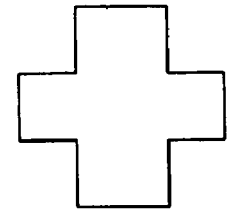 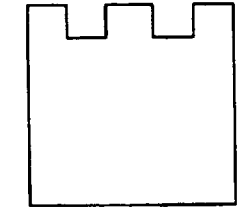
(i)      (j)      (k)
FIG. 9

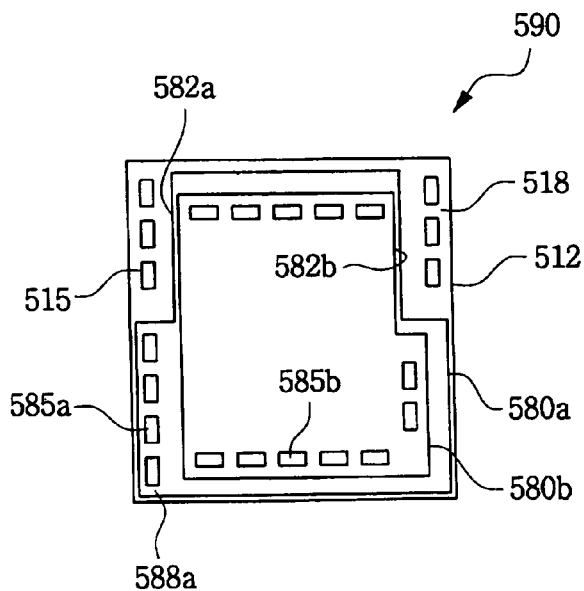
FIG. 30
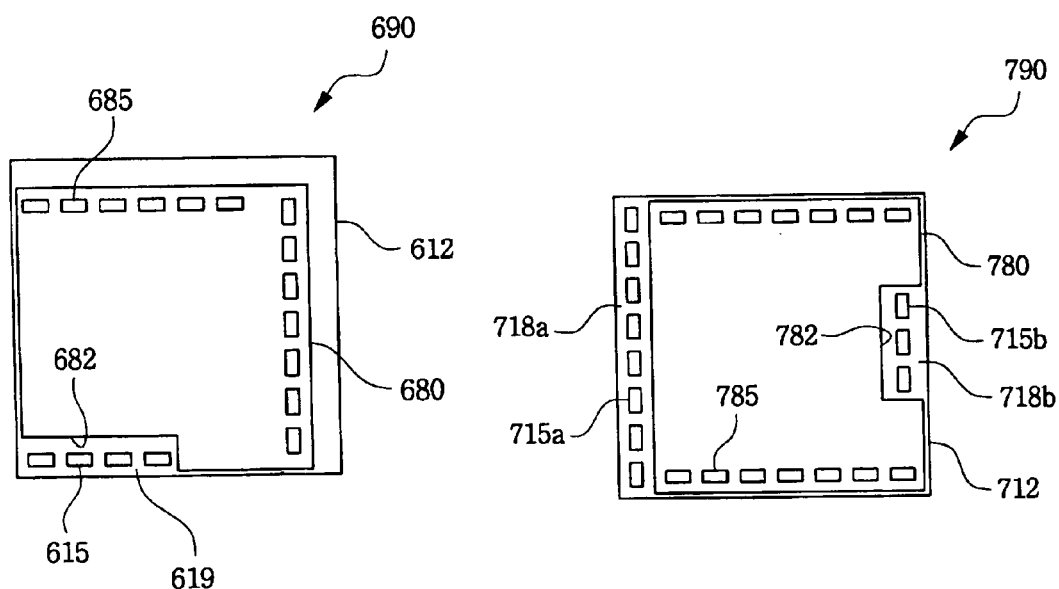
FIG. 31
FIG. 32

SEMICONDUCTOR PACKAGE HAVING STEP TYPE DIE AND METHOD FOR MANUFACTURING THE SAME

PRIORITY CLAIM

This U.S. non-provisional application claims priority under 35 U.S.C. § 119 to Korean Patent Application No. 2004-22666, which was filed Apr. 1, 2004, the contents of which are incorporated herein, in its entirety, by reference, and is a continuation-in-part of U.S. patent application Ser. No. 10/805,212, filed Mar. 22, 2004, now abandonded which claims priority under 35 U.S.C. § 119 to Korean Patent Application No. 2003-17968, which was filed Mar. 22, 2003, the contents of which are incorporated herein, in their entirety, by reference.

BACKGROUND OF THE INVENTION

1. Field of the Invention

The present invention relates generally to semiconductor integrated circuit (IC) chip and packaging assemblies thereof and, more particularly, to IC chips or dies having stepped, modified or otherwise non-rectangular peripheries and related single-chip or multi-chip packages incorporating one or more such IC chips in combination with other such IC chips and/or conventional IC chips.

2. Description of the Related Art

In general, semiconductor products are manufactured through three main process groupings or categories; i.e., wafer fabrication, package assembly, and test. Wafer fabrication typically includes all processing steps, e.g., thermal processing, ion implantation, deposition, planarizing, photolithography and etching, necessary to take a bare semiconductor wafer or other suitable substrate and create a number of integrated circuit (IC) devices in and on a primary surface.

After wafer fabrication has been completed and, in some instances, some preliminary parametric and/or functional testing has been performed, the semiconductor wafer will undergo a wafer dicing process. During this process, the thickness of the semiconductor wafer will typically be reduced by removing a backside portion and portions of the wafer below the scribe lines or kerf regions provided between adjacent IC chips is removed or split to separate the individual IC chips from each other. The wafer dicing process is also sometimes referred to as a wafer sawing or wafer scribing process.

Once the individual IC chips have been separated from the semiconductor wafer, they may assembled to form a final device package by, for example, attaching an IC chip to a substrate, such as a lead frame, that will provide for external connection to IC chip to a circuit board or socket. The IC chip and at least a portion of the substrate and the electrical connections formed between the chip and the substrate will typically be encapsulated for improving the resistance of the device package to mechanical damage and contamination from the external environment. The final device package may include one or more IC chips and, in the case of a multi-chip package, may include chips that are substantially identical or may include chips having a variety of functions and/or sizing. For example, a multi-chip package may be configured to include both a microprocessor IC chip coupled with a memory chip in a single package.

Most conventional IC chips have a generally square or rectangular shape when observed in a plan view. This configuration is due, at least in part, to the conventional wafer dicing technique which is shown in FIG. 1. As illustrated in FIG. 1, the dicing machine moves a rotating dicing blade 14 along the scribe lines S provided between adjacent rectangular IC chips 12 formed on semiconductor wafer 10. Because the cut length of the dicing blade 14 is typically at least a significant fraction of the lengths of the sides of the IC chips 12, the dicing machine is typically limited to making long, straight cuts and cannot effectively or efficiently cut more complex IC chip profiles. Accordingly, conventional IC chip profiles are almost exclusively rectangular, although triangular or non-rectangular parallelogram profiles are also possible.

An alternative dicing technique has been developed that utilizes a laser scriber rather than the conventional dicing blade to address some of the problems associated with dicing blades, such as chipping, that can reduce device yield and/or reliability. A laser dicing or scribing technique is, for example, taught in Applicants previous U.S. patent application Ser. No. 10/805,212, for forming non-rectangular IC chip profiles. For example, a Mahoh Dicing Machine, available from Tokyo Seimitsu Co., Ltd., may be utilized for cutting semiconductor wafers using a non-contact method that tends to reduce or eliminate the damage to the wafer surface associated with conventional sawing. Specifically, the laser dicer focuses a laser beam on a subsurface region of the semiconductor wafer to form a modified region that tends to grow or propagate vertically along a narrow width for separating IC chips while reducing damage, such as chipping, associated with removing a portion of the wafer with abrasives as in conventional sawing techniques.

The generally square or rectangular shape of the conventional IC chip tends to be reflected in the shape of the packages incorporating such IC chips, whether the package is a single-chip package or a multi-chip package. Because the shape of the conventional packages, like the conventional IC chips, is generally square or rectangular, the sizing of the various packages mounted on a single substrate, such as a circuit board, may reduce the packing density that may be obtained and/or increase the size of the substrate required to mount all of the intended IC chips.

Moreover, the conventional square or rectangular shape of the IC chips may complicate efforts to reduce the overall height or thickness of multi-chip packages. For example, when two IC chips are stacked, if the upper chip is of a size that will obstruct one or more bond pads on the lower chip, a suitable spacer must be inserted between the chips to ensure that the bond pads of the lower chip remain accessible. As illustrated in FIG. 3A, however, incorporating a spacer will tend to increase the overall thickness of the resulting chip stack by a dimension S2.

One approach for addressing this interference between the upper and lower IC chips has been to remove a lower peripheral portion of the upper chip to form a recessed opening of sufficient size to permit wire bonding to the bond pads of the lower chip as illustrated in FIG. 3B. However, because portions of the upper chip are thinned, this technique may introduce additional problems by increasing the likelihood that the weaker cantilevered portion of the upper chip may be cracked or broken during wire bonding when compared with the performance of a corresponding full thickness chip.

Another approach for addressing the obstruction of the bond pads on the lower chip is rotating the upper chip with respect to the lower chip to provide for a "diagonal" mounting orientation and thereby expose additional wire-bonding areas on the lower chip. This technique is, however, somewhat limited in the range of relative chip sizes and orientations for which improved access to the lower chip bond pads is achieved without also creating significant cantilevered portions that would be more susceptible to mechanical damage, increasing the overall package size, and/or increasing the complexity of the apparatus and/or control device used to achieve the offset alignment.

SUMMARY OF THE INVENTION

Exemplary, non-limiting embodiments of the invention provide a variety of IC chips having non-rectangular edge profiles incorporating one or more recessed portions and single chip and multi-chip packages that incorporate one or more of such stepped or modified edge profile IC chips.

Exemplary semiconductor dies according to the invention will include a modified generally rectangular periphery characterized by a maximum width $W_0$ and a maximum length $L_0$. As illustrated in FIG. 5A, a single recessed region $R_1$ formed along one side and extending to the corner which will reduce the width dimension of the adjacent side by a first recess depth $D_{r1a}$, thereby forming a first minor width $W_{1a}$, and reduce the original length $L_0$ by the first recess length $L_{r1a}$, thereby forming a first minor length $L_{1a}$. As will be appreciated, the number, sizing and relative positioning of the recessed region or regions incorporated in an IC chip according to the invention may produce a range of major and minor edges and dimensions. Further, the recessed region(s) may be positioned in a generally asymmetric manner with respect to the primary rectangular base structure or, alternatively, may be configured to be symmetrical about one or more vertical, horizontal or diagonal axes.

An exemplary method for manufacturing such stepped profile IC chips includes the steps of forming a plurality of dies on a semiconductor wafer, wherein each of the individual die includes a die periphery that includes a recessed region and then separating the individual dies from the wafer. An exemplary technique for separating the individual dies from the semiconductor wafer includes laser scribing the die periphery to form weakened regions in the wafer and then separating the individual die from adjacent dies along the weakened regions. Another exemplary technique for separating the individual dies from the semiconductor wafer includes removing an upper portion of the wafer adjacent the recessed region and outside the die periphery to form an opening in an active surface of the wafer, removing a lower portion of the wafer thickness from a side opposite the active surface, i.e., backside, the total of the upper portion and the lower portion being at least equal to an original thickness of the wafer, and then removing a remaining portion of the wafer along scribe lines provided between adjacent die.

The exemplary stepped profile dies according to the invention may be arranged or patterned on a semiconductor wafer in a number configurations. One such exemplary configuration places adjacent die whereby the recessed regions of at least two adjacent dies are complementary and the adjacent dies are separated by a substantially uniform distance along their entire periphery. Another such exemplary configuration places adjacent dies whereby the recessed regions of at least two adjacent dies are not completely complementary and the adjacent dies are separated by substantially different distances at different points along adjacent portions of the die peripheries.

In addition to the stepped or modified edge profile provided on the exemplary IC chips, the bond pad configuration may also be modified with an exemplary configuration locating a plurality of bond pads adjacent the die periphery whereby no bonding pads are provided adjacent a portion of the die periphery bordering the recessed region. Another exemplary configuration includes plurality of bonding pads provided along only a single substantially linear portion of the die periphery.

Also provided are a range of exemplary multi-chip packages incorporating one or more exemplary stepped edge profile IC chips or dies. One such exemplary package includes a substrate, the substrate having a contact region; and a first semiconductor die having a stepped periphery including a recessed region, wherein the first semiconductor die is mounted on the substrate in a manner whereby the contact region is exposed within the recessed region. Another exemplary package includes, as the substrate, a lower semiconductor die having a contact region that includes at least one bond pad; and a plurality of bond pads are provided on an active surface of the first semiconductor die. Another exemplary package includes bond pads arranged on the active surface of the first semiconductor whereby the bond pads are positioned only on an extended, i.e., not recessed, region. Another exemplary package includes a substrate, the substrate having a contact region; and a first semiconductor die having a stepped periphery including a recessed region, with the first semiconductor die mounted on the substrate in a manner whereby the contact region is exposed within the recessed region.

Also disclosed are a range of exemplary method of manufacturing such packages. An exemplary method includes the steps of preparing a substrate; mounting a first semiconductor die on the substrate, the first semiconductor die including a first plurality of bond pads; forming second semiconductor die having a stepped periphery including a first recessed region; and mounting the second semiconductor die on the first semiconductor die, the second semiconductor die being mounted on the first semiconductor die in a manner whereby the first plurality of bond pads is exposed within the first recessed region. Another exemplary method may include additional steps including forming a third semiconductor die having a modified rectangular periphery including a second recessed region and mounting the third semiconductor die on the second semiconductor die, the third semiconductor die being mounted on the second semiconductor die in a manner whereby a second plurality of bond pads provided on an active surface of the second semiconductor device is exposed within the second recessed region. Other exemplary embodiments may also include the steps of forming electrical connections between the first and second plurality of bond pads and the substrate and/or forming electrical connections between a third plurality of bond pads provided on an active surface of the third semiconductor die and the substrate.

Another exemplary method of manufacturing a semiconductor device package may include preparing the first, second and third semiconductor dies to have substantially identical configurations, and assembling the dies such that the second semiconductor die is in an orientation rotated approximately 180° relative to the first semiconductor die and the third semiconductor die. Another exemplary method of manufacturing a semiconductor device package may include preparing first, second and third semiconductor dies having substantially identical configurations, and assembling the dies such that the second semiconductor die being in an orientation rotated approximately 90° relative to the first semiconductor die and the third semiconductor die.

Another exemplary embodiment of a planar package configuration according to the invention includes a first semiconductor die, the first semiconductor die having a stepped periphery including a recessed region, the first semiconductor die being mounted on a substrate; and a second semiconductor die, the second semiconductor die being mounted in a generally planar orientation relative to the first semiconductor die and in a manner whereby at least a portion of the second semiconductor die lies within the recessed region. Other exemplary embodiments include IC chip configurations in which the second semiconductor die lies substantially within the recessed region or, alternatively, lies completely within the recessed region.

BRIEF DESCRIPTION OF THE DRAWINGS

The invention will become more apparent by describing in detail exemplary embodiments thereof with reference to the attached drawings in which:

FIG. 8 is a plan view of an IC chip according to the invention;

FIG. 9 illustrates a variety of possible IC chip stepped edge profiles (a) to (k) according to the invention;

FIGS. 30-32 are plan views of exemplary multi-chip stack packages according to the invention.

Figure 1:
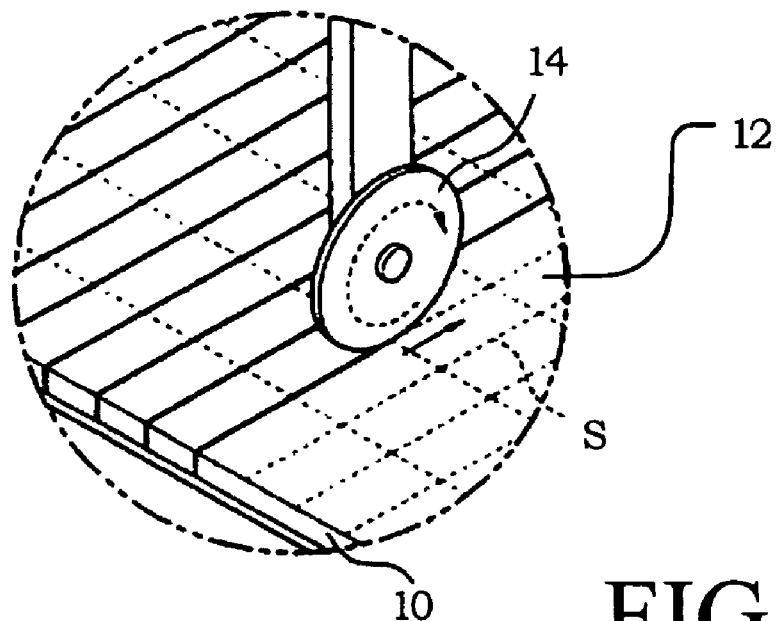
FIG. 1 is a perspective view showing a conventional wafer dicing process.
Figure 2:
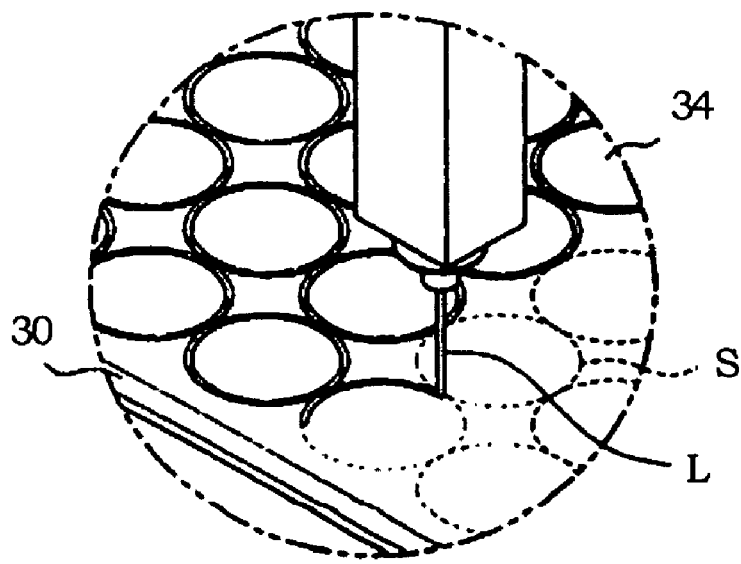
FIG. 2 is a view a laser wafer dicing process.
Figure 3A:
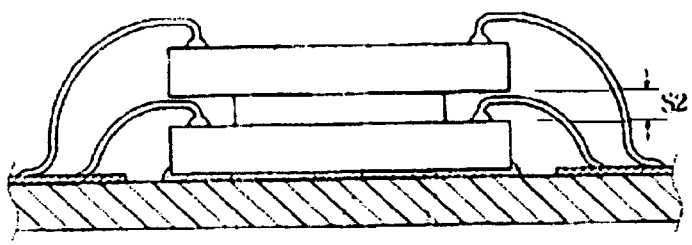
FIGS. 3A and 3B illustrate two different conventional stacked chip packages.
Figure 3B:
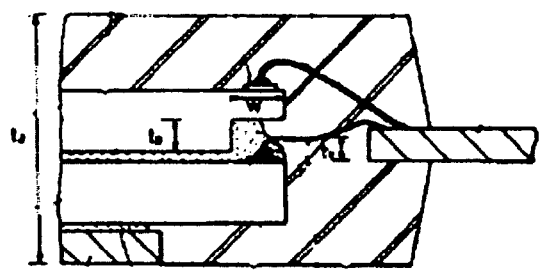

These drawings have been provided to assist in the understanding of the exemplary embodiments of the invention as described in more detail below and should not be construed as unduly limiting the invention. In particular, the relative spacing, positioning, sizing and dimensions or the various elements illustrated in the drawings are not drawn to scale and may have been exaggerated, reduced or otherwise modified for the purpose of improved clarity. Those of ordinary skill in the art will also appreciate that a range of alternative configurations have been omitted simply to improve the clarity and reduce the number of drawings. Similarly, those of ordinary skill will appreciate that certain of the various structural elements illustrated in the exemplary embodiments may be selectively and independently combined to form other structural configurations useful for manufacturing IC chips and semiconductor device packages incorporating such IC chips without departing from the scope and spirit of this disclosure.

DETAILED DESCRIPTION OF EXEMPLARY EMBODIMENTS

A variety of, non-limiting, exemplary embodiments of the present invention will now be described more fully hereinafter with reference to the accompanying drawings. Those of ordinary skill in the art will, however, appreciate that the invention may be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention. In the description, those structures and processes that would be well-known to one of ordinary skill in the art have not been described or illustrated in detail to avoid obscuring the present invention.

Figure 4:
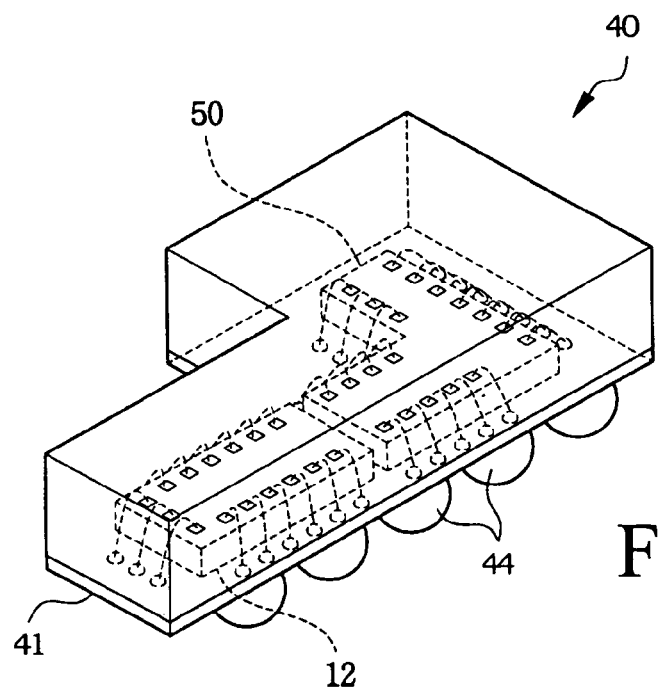
FIG. 4 illustrates an embodiment of the invention.

FIG. 4 illustrates an exemplary embodiment of the invention in which a multi-chip package 40 incorporates a first IC chip 12 having a conventional rectangular edge profile and a second IC chip 50 having a modified edge profile according to the invention. The IC chips 12, 50 are mounted on a substrate 41 which also provides external connection structures, such as solder balls 44, for connecting the IC chips to a circuit board or appropriately configured socket or other fixture.

As illustrated in FIGS. 5A and 5B, IC chips according to the invention depart from a conventional rectangular edge profile, $W_0 \times L_0$, by incorporating one or more recessed regions $R_1 \ldots R_n$, having recessed edges that may be substantially parallel to the outermost or primary edge segments. Illustrated in FIG. 5A is an exemplary chip that incorporates a single recess $R_1$, characterized by a depth, $D_{r1a}$ and a length $L_{r1a}$ that reduce the original $W_0$ and $L_0$ dimensions to $W_{1a}$ and $L_{1a}$ respectively. More than one recessed region may be provided along one or more of the primary edge segments and recessed regions provided on adjoining primary edge segments may intersect and cooperate to define a generally L-shaped recessed region (not shown). The IC chip and the placement and orientation of the recessed region(s) may be characterized with respect to both diagonal axes D1, D2, and a pair of perpendicular axes V, H and may exhibit symmetry with respect to one or more of the axes. Illustrated in FIG. 5B is an exemplary chip incorporating two recessed regions $R_1$, $R_2$, the $R_2$ recess being characterized by a recess length $L_{r2a}$ and depth $D_{r2a}$ that may be the same as or different from the corresponding dimensions of the first recess and result in an addition reduction of the original width to $W_{2a}$ and a second reduced length $L_{2a}$.

Figure 6:
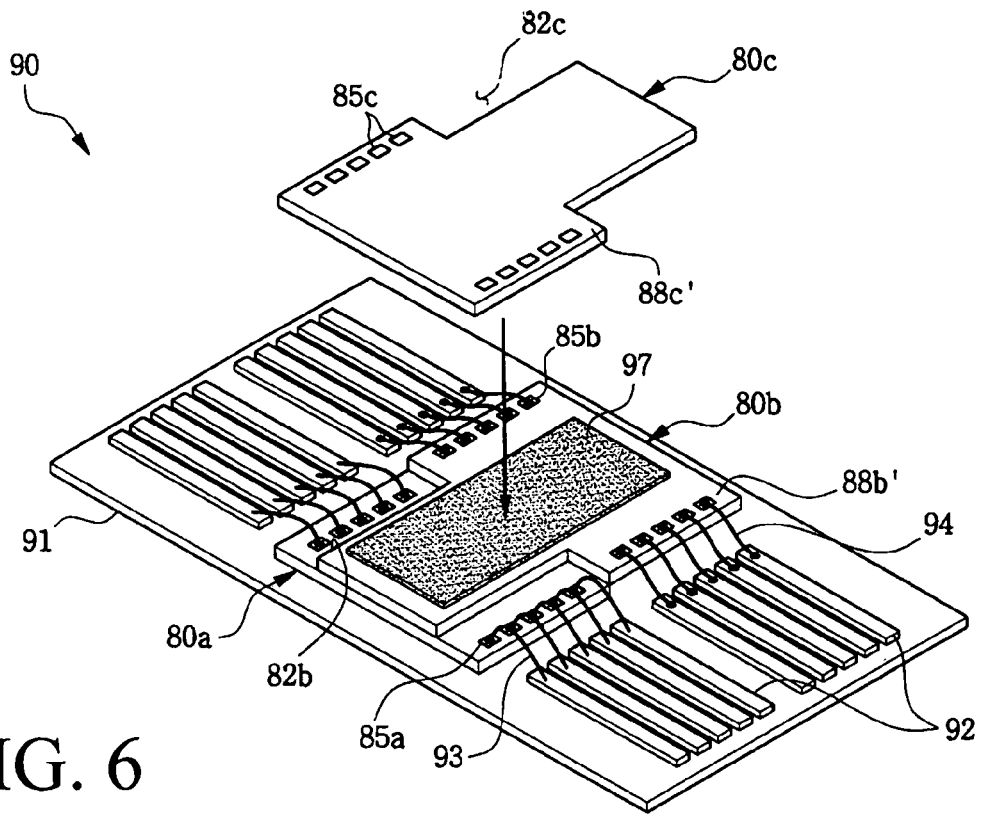
FIG. 6 illustrates the assembly of a multi-chip package according to the invention.
Figure 7:
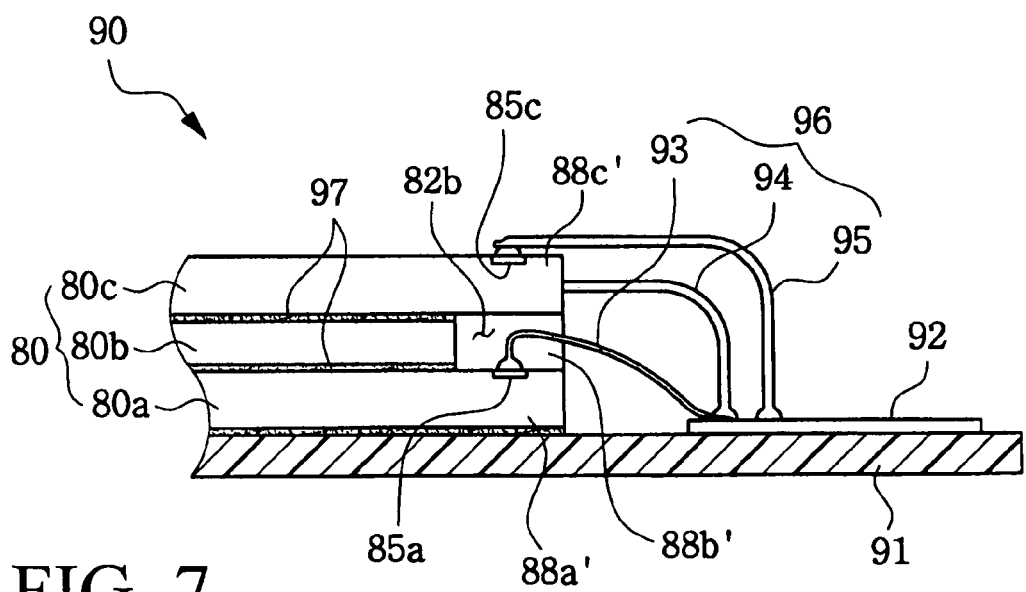
FIG. 7 is a partial cross-section of the assembled multi-chip package of FIG. 6.

As illustrated in FIGS. 6 and 7, a multi-chip stack package 90 includes a substrate 91 on which a plurality of leads or other conductive patterns 92 are arranged around a central chip mounting region. A plurality of IC chips 80a, 80b, 80c, are sequentially mounted in a stacked configuration on the chip mounting region of the substrate. Each of the IC chips includes a pair of recessed regions 82a, 82b, 82c provided on opposite sides of one end of the IC chip. The ends of the IC chips opposite the recessed regions 88a', 88b', 88c' remain substantially full width and include a plurality of bond pads 85a, 85b, 85c for connecting bonding wires 93, 94, 95, collectively 96, between the respective IC chips and the leads 92. The IC chips 80a, 80b, 80c may be attached to the substrate and one another using any suitable adhesive layer 97 with each of the upper IC chips 80b, 80c being rotated 180° relative to the IC chip on which it is being mounted. In this manner the recessed regions 82b', 82c' of the upper IC chips are aligned with the full width regions 88a', 88b' of the IC chips on which they are mounted, thereby providing an opening slightly larger than the thickness of the IC chips for attaching bonding wires 93 to the bond pads 85a of the bottom IC chip.

As illustrated in FIG. 8, forming a single recessed region 32 in IC chip 30 having nominal side surfaces 36, 37, substantially perpendicular to one another and that intersect at the corners 31 of the IC chip will produce at least two outer side surfaces 36', 37' having reduced length and recessed side surfaces 36", 37". Depending on the relative sizing and placement of the single recessed region the IC chip 30 may assume a generally L-shaped, when the recessed region encompasses a corner, or C-shaped, when the recessed region is contained within one side surface of the IC chip (not shown in FIG. 8).

Figure 5:
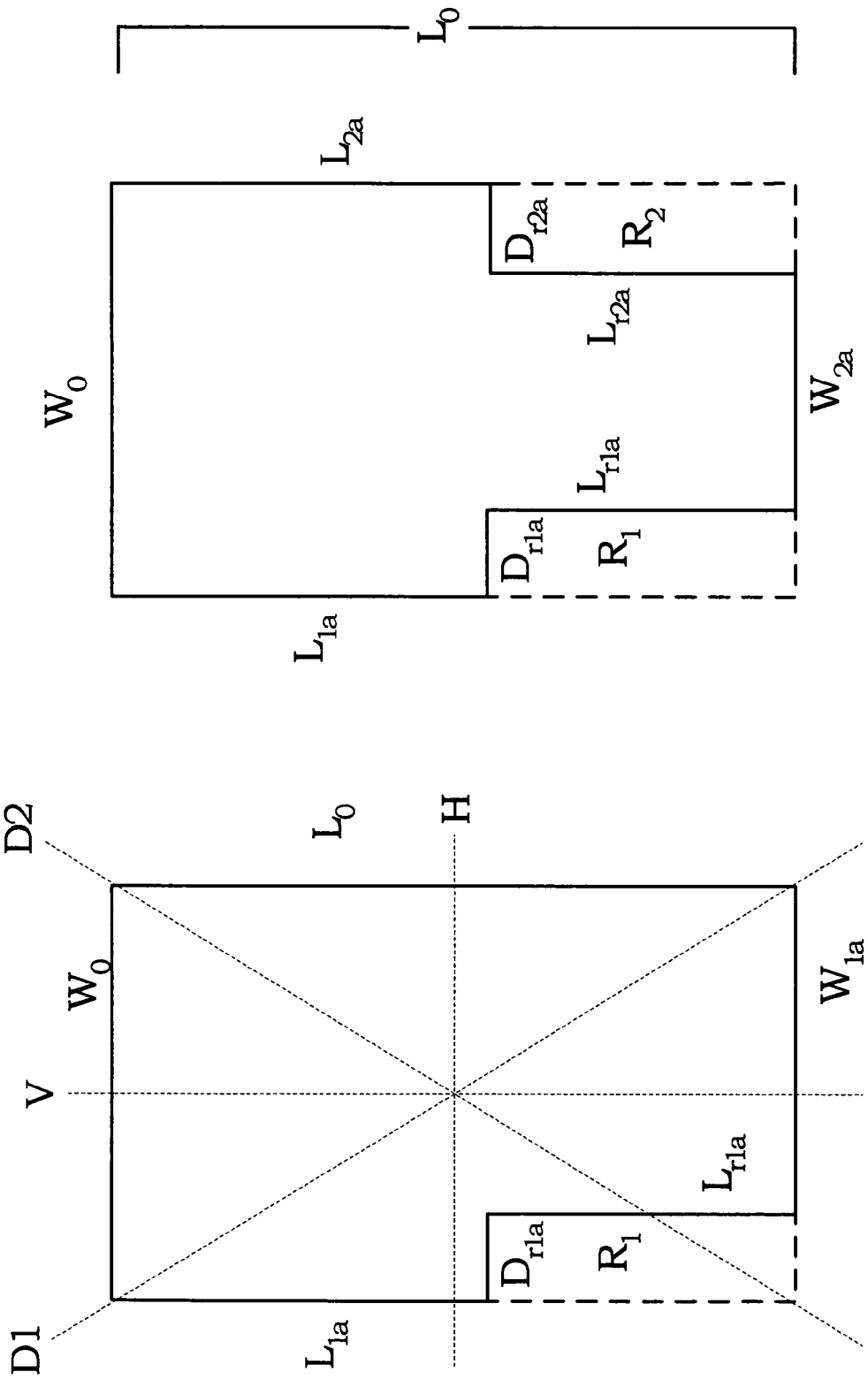
FIGS. 5A and 5B illustrate exemplary embodiments of the invention with representative dimensions and axes.

When more than one recessed region is utilized, a wide variety of IC chip edge profiles may be produced as suggested by the exemplary edge profiles illustrated in edge profile diagrams (a) through (k) of FIG. 9. As indicated in FIG. 5, depending on the sizing and placement of the recessed regions, the resulting IC chip edge profiles may exhibit symmetry about one or more of the primary diagonal and/or perpendicular axes. For example, edge profile diagram (a) would be symmetrical about axis V, edge profile diagram (b) would be symmetrical about axes V and H, and edge profile diagram (e) would be symmetrical about axes D1, D2, V and H.

Figure 10:
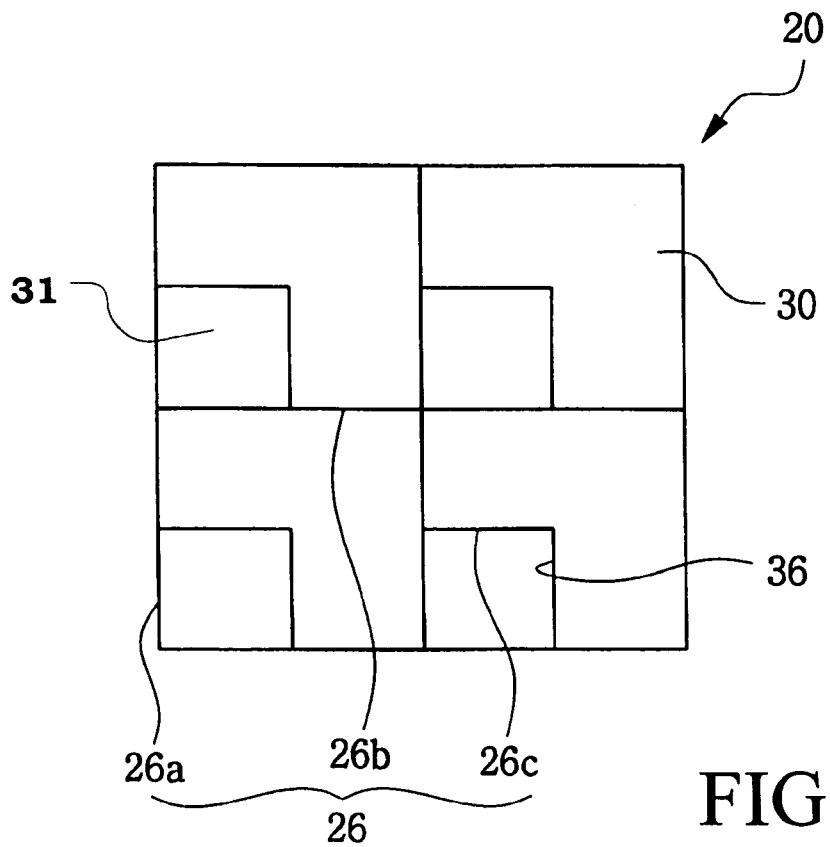
FIGS. 10 and 11 illustrate alternative orientations of a plurality of IC chips as illustrated in FIG. 8 on the surface of a semiconductor wafer.

As illustrated in FIG. 10, a plurality of IC chips 30 can be arranged on a semiconductor wafer in a repeating pattern having step dimensions corresponding to the primary dimensions of the IC chip. As shown, all of the IC chips are arranged in substantially the same orientation and may be separated by scribing, particularly by laser scribing, along the various scribe lines 26a, 26b, 26c, 36. Once scribed, a portion 31 can be removed to form the recessed region in the IC chip 30. It portion 31 does not contain a separate semiconductor device, this portion of the semiconductor wafer is typically scrap.

Figure 11:
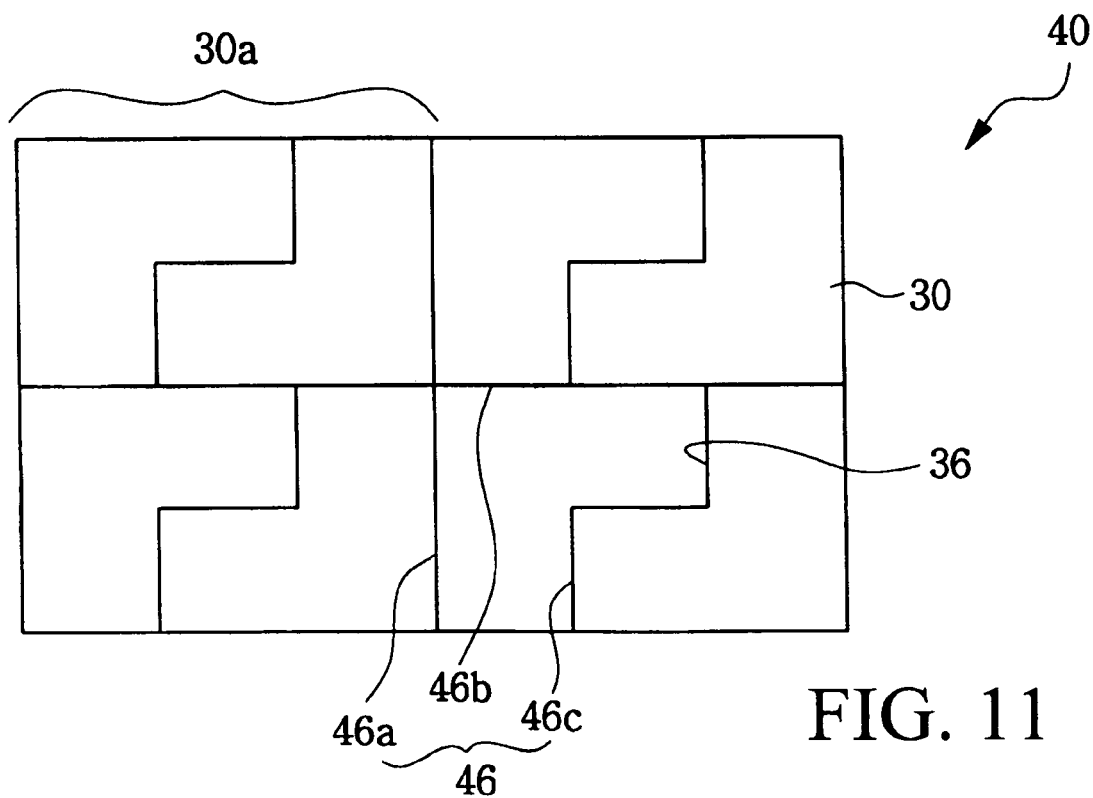

As illustrated in FIG. 11, in those instances in which the IC chip 30 has a suitable edge profile, two or more of the IC chips can be grouped as a unit 30a that has a generally rectangular periphery. This grouping can then be repeated across the surface of the semiconductor wafer with the individual IC chips subsequently being separated along scribe lines 30, 36, 46a, 46b, 46c and thereby reduce the scrap associated with unpatterned portions of the semiconductor wafer and reduce the effective cost of each of the resulting devices.

Figure 12:
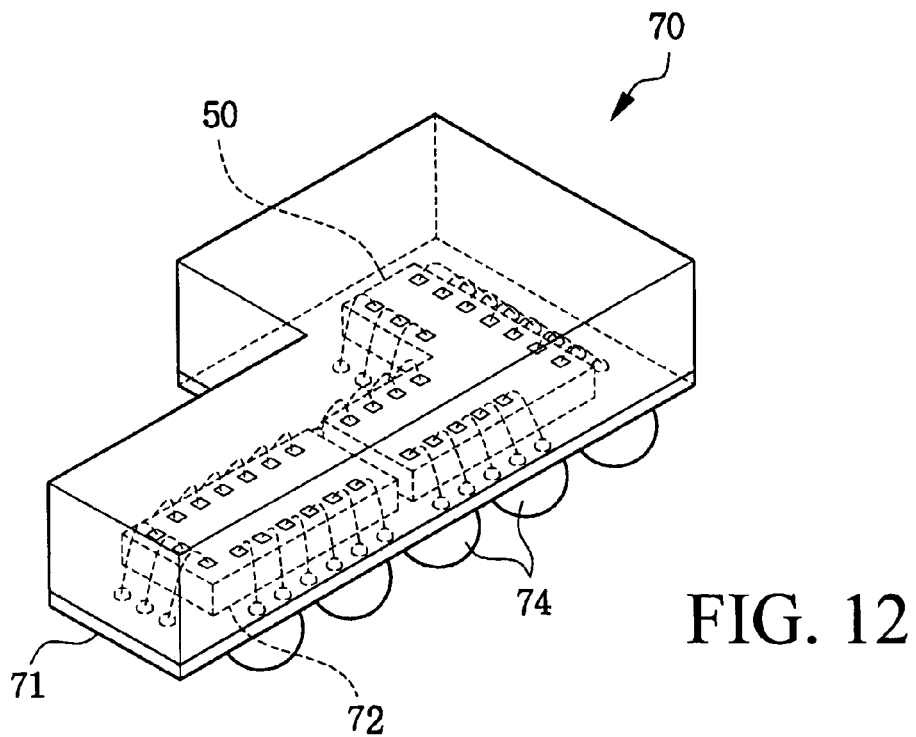
FIGS. 12 and 13 are perspective views of embodiments of the invention.

FIG. 12 illustrates an exemplary embodiment of the invention in which a multi-chip package 70 incorporates a first IC chip 12 having a conventional rectangular edge profile and a second IC chip 50 having a modified edge profile according to the invention. The IC chips 12, 50 are mounted on a substrate 71 which also provides external connection structures, such as solder balls 74, for connecting the IC chips to a circuit board or appropriately configured socket or other fixture.

Figure 13:
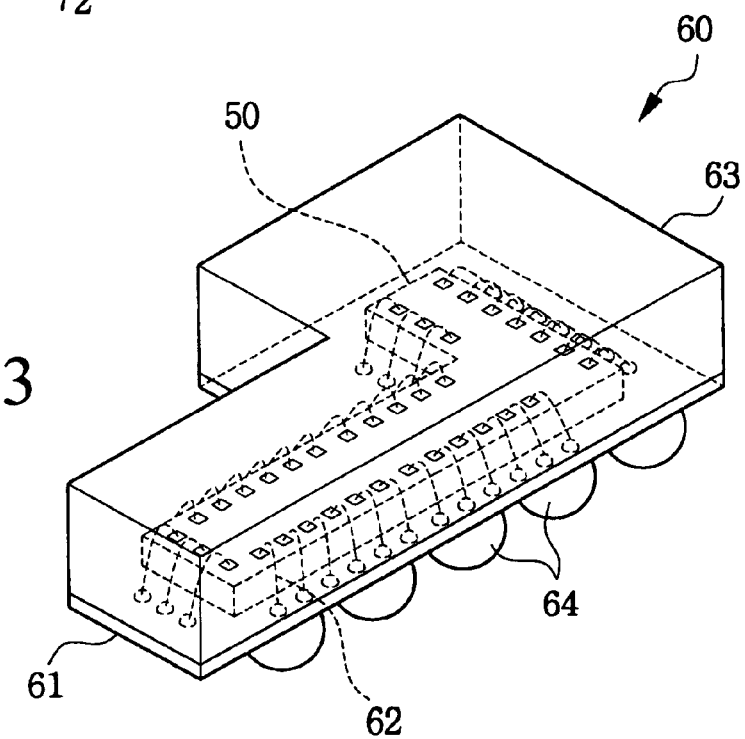

FIG. 13 illustrates an exemplary embodiment of the invention in which a single-chip package 60 incorporates a single IC chip 50 having a modified edge profile according to the invention. The IC chip 50 are mounted on a substrate 61 which also provides external connection structures, such as solder balls 64, for connecting the IC chips to a circuit board or appropriately configured socket or other fixture. In both FIGS. 12 and 13, the resulting semiconductor device package also exhibits a non-rectangular edge profile that generally corresponds to the configuration of the chip and/or chips provided on the leadframe.

Figure 14:
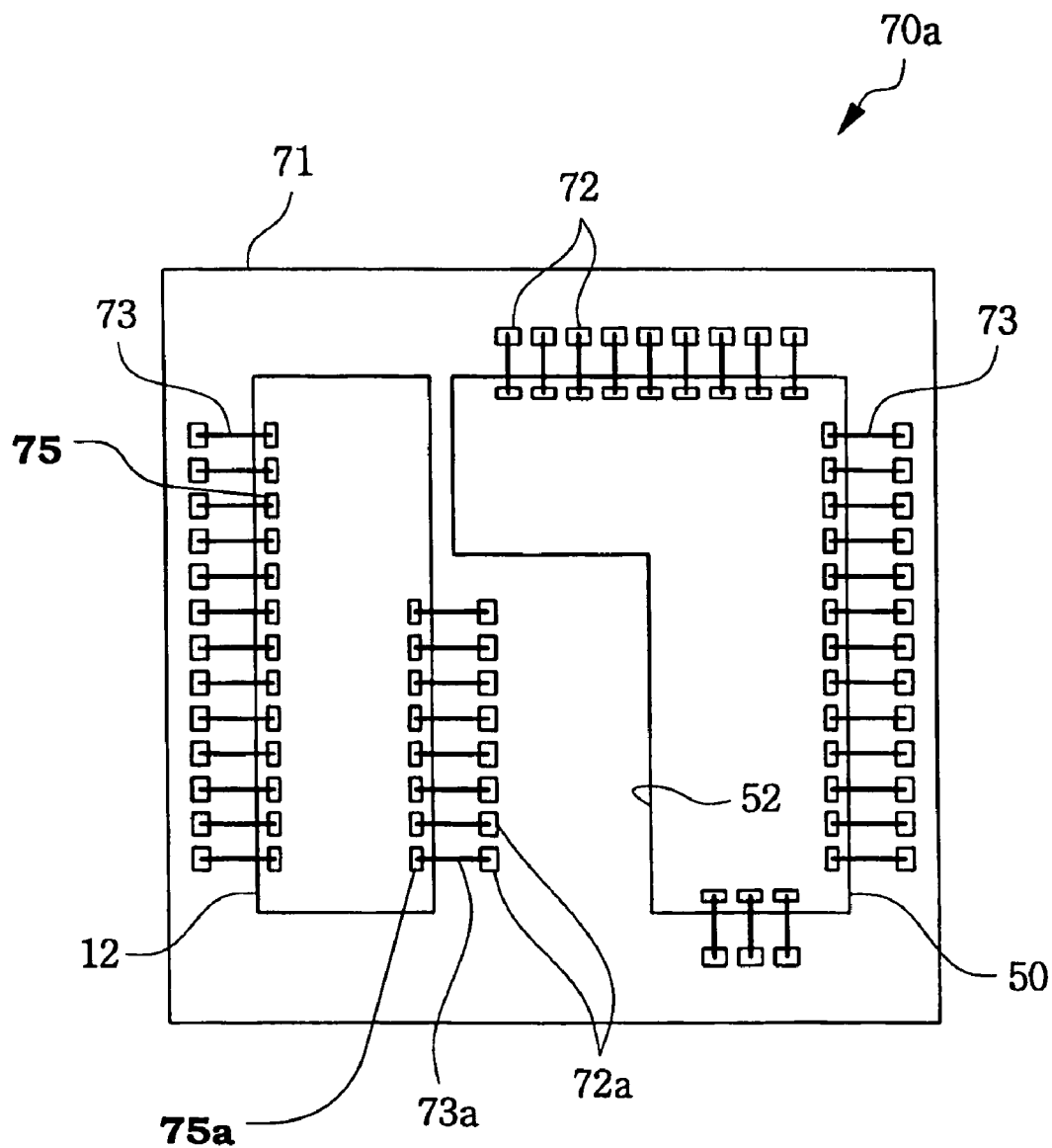
FIG. 14 is a plan view of a multi-chip package according to the invention.

As illustrated in FIG. 14, in addition to incorporating an edge profile modified with one or more recessed regions, IC chips according to the invention may also incorporate a modified distribution of the bond pads that may take into consideration the placement and connection means of adjacent IC chips. As illustrated in FIG. 14, a multi-chip package 70a includes both a rectangular IC chip 12 and a modified IC chip 50. However, rather than the conventional uniform distribution of bond pads along opposing edges and/or along a generally longitudinal axis, the bond pads 72, 72a, 75, 75a of both the IC chips 12, 50 and the substrate 71, have been distributed somewhat asymmetrically. In particular, in this instance the modified IC chip 50 does not include any bond pads along the edge 52 of the recessed region, while the rectangular IC chip 12 includes internal bond pads 75a, i.e., bond pads not adjacent an exterior portion of the substrate 71, along only a portion of one edge, taking into account the reduced spacing between the IC chips 12, 50 along another portion of that same edge. The bond pads on the IC chips and the substrate are, in turn, connected with a series of bonding wires 73, 73a.

Figure 15A:
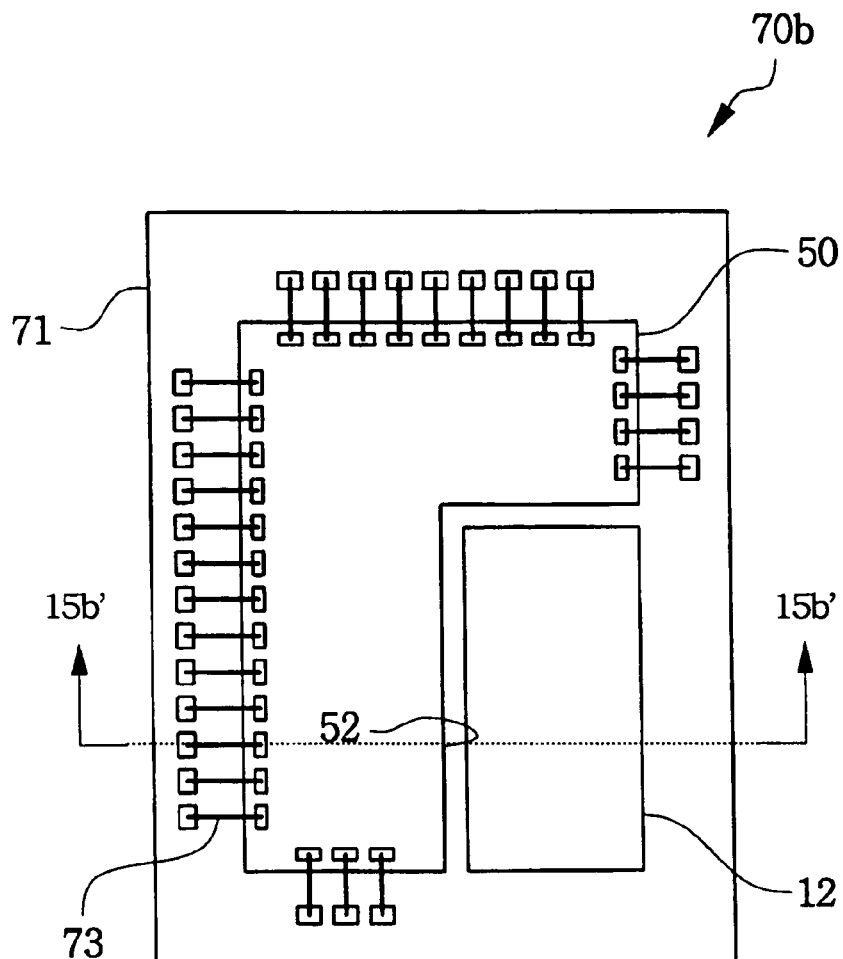
FIGS. 15A and 15B are a plan view and a cross-sectional view respectively of an embodiment of a multi-chip package according to the invention.
Figure 15B:
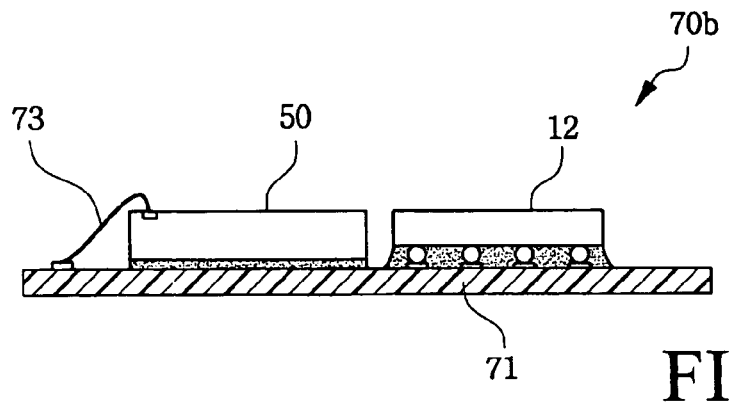

As illustrated in FIGS. 15A and 15B, another exemplary embodiment of a multi-chip package 70b according to the invention includes IC chips 12, 50 in which the bond pad arrangement on IC chip 50 does not include any bond pads along the edge 52 of the recessed portion. As illustrated in FIG. 15B, a cross section view taken along the line 15b'-15b' of FIG. 15A, the IC chip 12 may be configured for flip chip mounting whereby an array of bond pads (not shown) on the active surface of the IC chip are connected directly to corresponding bond pads provided on the substrate through a conductive structure such as solder balls or solder bumps and thereby avoid the use of bonding wires for connecting chip 12.

Figure 16:
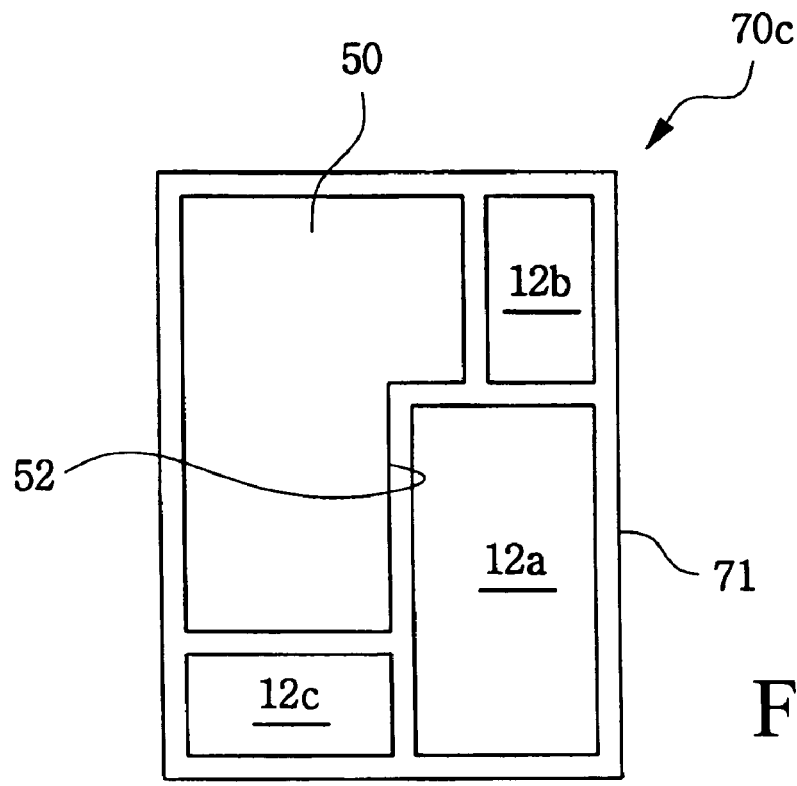
FIGS. 16 and 17 are plan views of alternative embodiments of multi-chip packages according to the invention.

As illustrated in FIG. 16, another exemplary embodiment of multi-chip packages according to the invention may include IC chips 12a, 12b, 12c, 50, configured for flip chip mounting to the substrate 71 to avoid the need for any bonding wires at all, thereby tending to provide for a higher packing density of the IC chips on the substrate and providing for a single attachment technique. As suggested by FIG. 16, the packing density can also be improved by the use of appropriately sized IC chips that cooperate to fill the substrate surface substantially completely.

Figure 17:
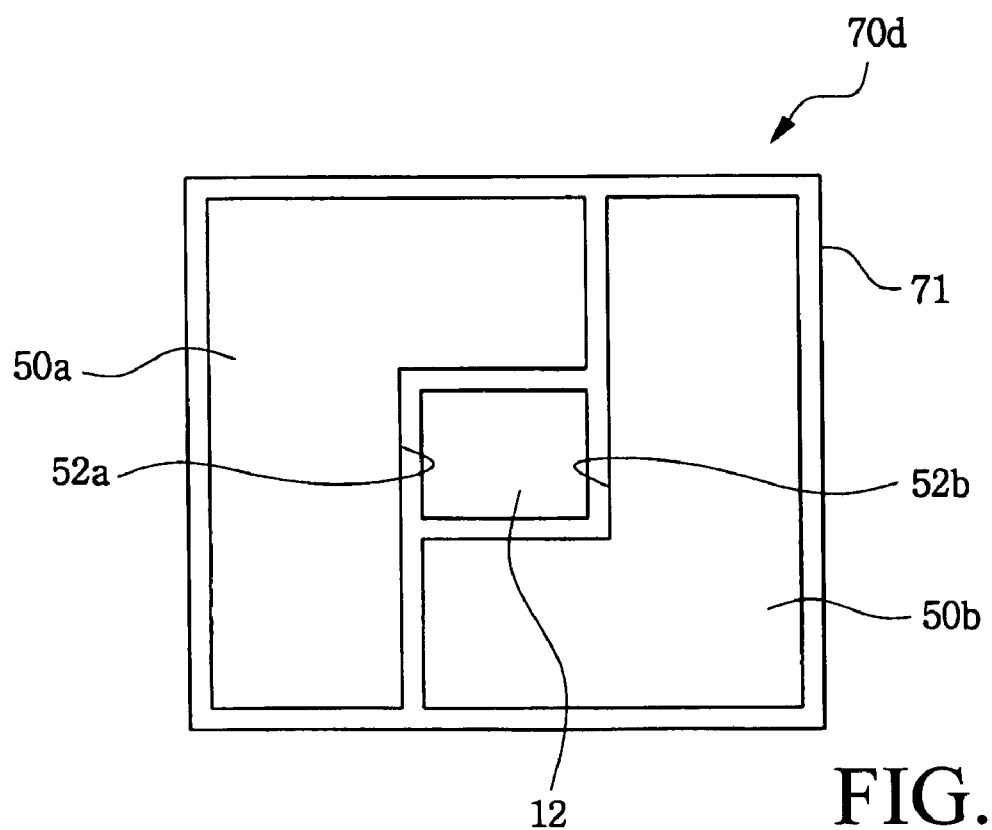

As illustrated in FIG. 17, another exemplary embodiment of multi-chip packages according to the invention may include IC chips 12, 50a, 50b in which the edges 52a, 52b of the recessed portions of the stepped edge profile IC chips cooperate to form an internal opening into which IC chip 12 may be placed. Again, each of the incorporated IC chips may be configured for flip chip mounting to the substrate 71 to avoid the need for any bonding wires at all, thereby providing for a higher packing density of the IC chips on the substrate and providing for a single attachment technique.

Figure 18:
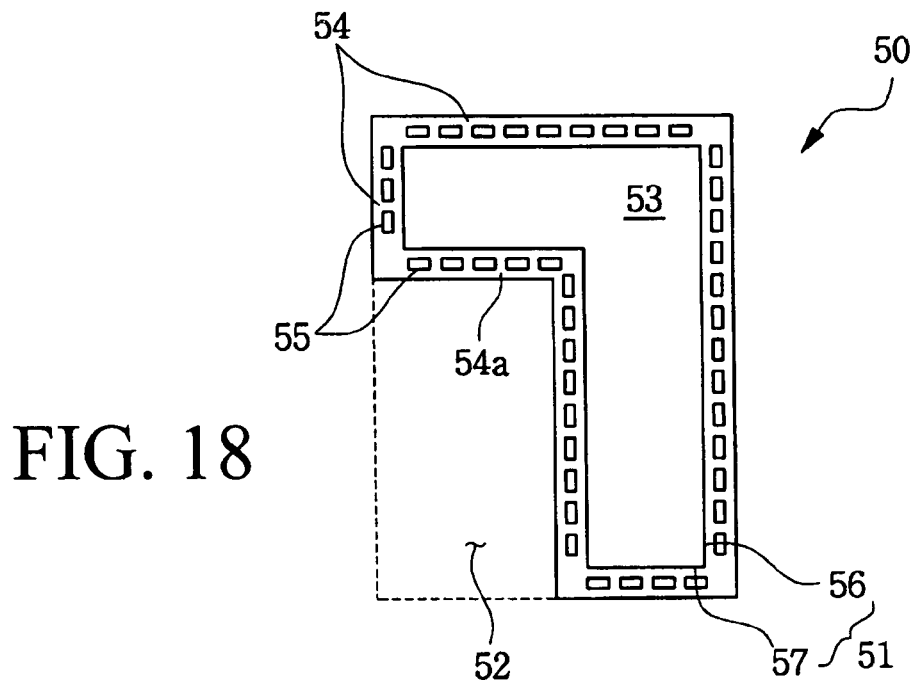
FIGS. 18 and 19 are plan views of alternative exemplary IC chips according to the invention.
Figure 19:
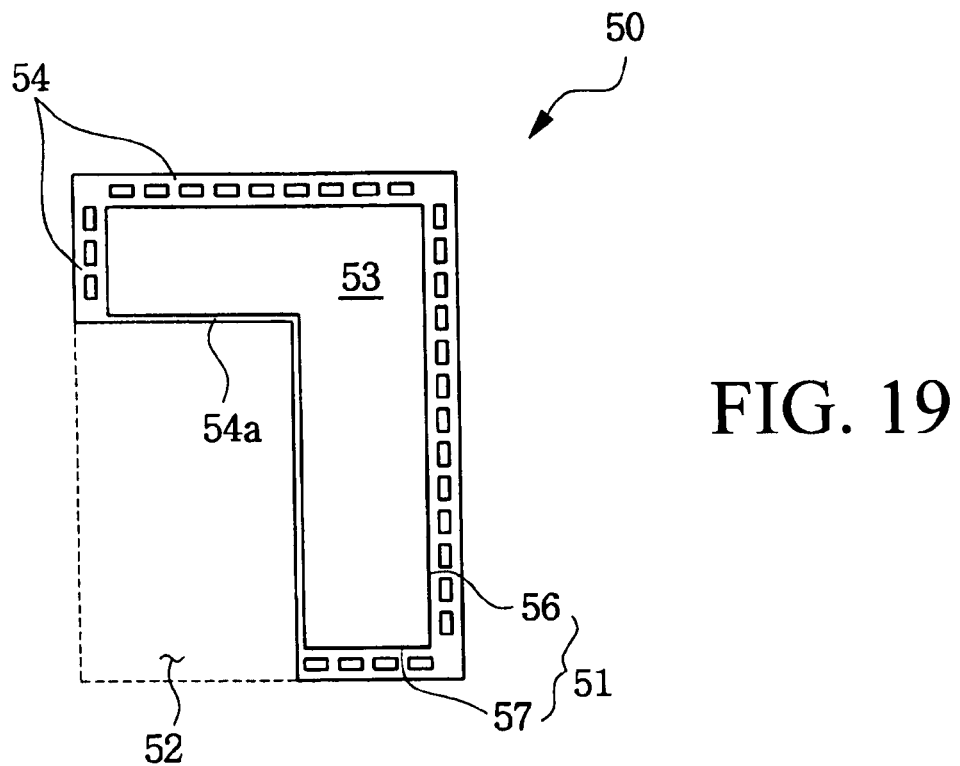

As illustrated in FIG. 18, an exemplary embodiment of the stepped or modified edge profile IC chip 50 may include exterior or primary edges 57, 56, corners 51 and a minor or recessed portion edge 54a, along which bond pads 54, 54a may be distributed generally uniformly. Conversely, as illustrated in FIG. 19, another exemplary embodiment of a similar modified edge profile IC chip 50 may provide bond pads only along the external edges, i.e., having no bond pads along the recessed edge portion 54a, which may be particularly useful for incorporation in the basic multi-chip configuration illustrated in, for example, FIG. 17, wherein another IC chip or chips will be positioned at least partially within the open area defined by the recessed portion and would tend to complicate conventional wire bonding along the recessed edge.

Figure 20A:
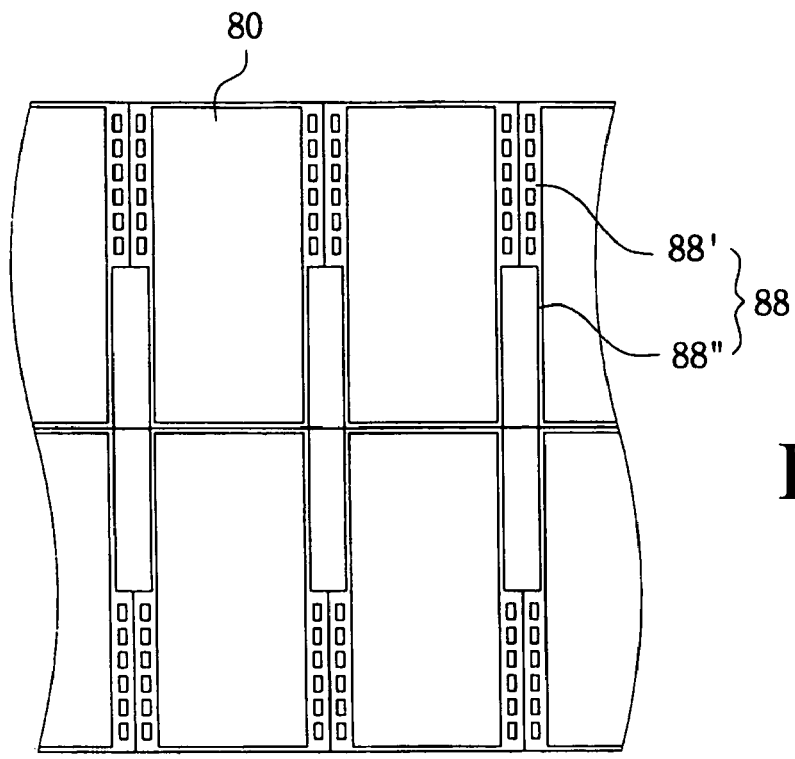
FIGS. 20A, 20B and 21 are, respectively, plan views of alternative arrangements of exemplary IC chips according to the invention formed on a semiconductor wafer and an IC chip as illustrated in FIGS. 20A-20B after separation from the semiconductor wafer.
Figure 20B:
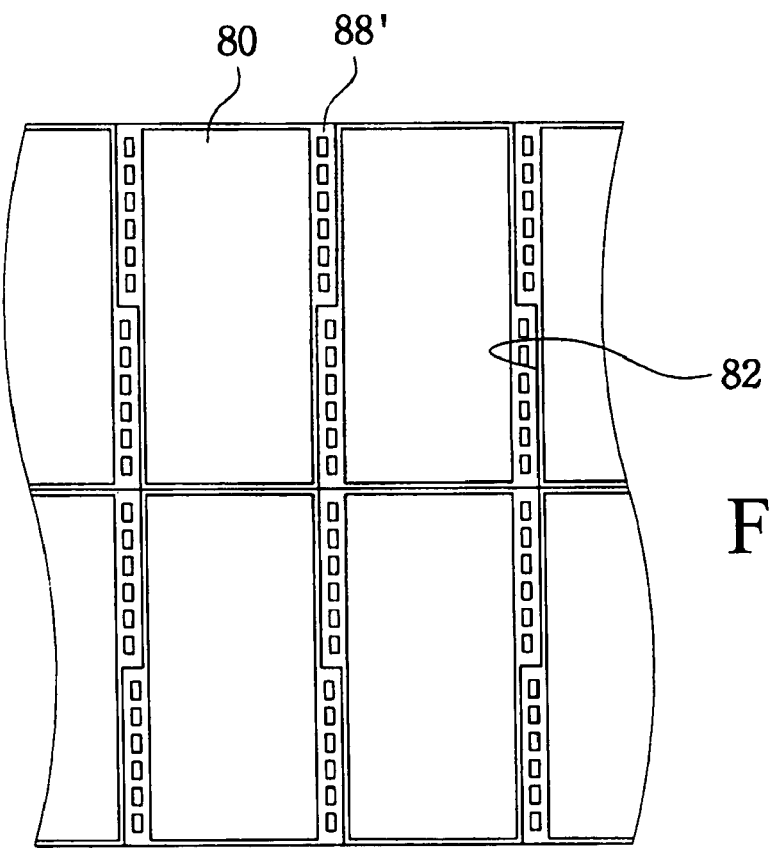

FIGS. 20A and 20B illustrate alternative arrangements for a plurality of stepped or modified edge profile IC chips 80 having an opposed pair of primary edges 88 that include both a substantially standard portion 88' on which bond pads are provided and a recessed portion 88". As seen in FIG. 20B, by alternating the orientation of the IC chips being formed on the semiconductor substrate, the open or scrap region can be reduced or eliminated and the chip density increased accordingly. In some instances however, it may be desirable to maintain portion of the semiconductor wafer such as that in FIG. 20A that will not be incorporated into the final IC chips. Such regions may be used for forming test plug structures to allow enhanced parametric and functional testing of the structures formed, particularly when establishing a new manufacturing process or qualifying a new line or a new piece of equipment. Such test structures may incorporate a series of capacitors, resistors, transistors and alignment structures that can be analyzed to provide a much more detailed understanding of the quality and effective sizing of the key functional components.

Figure 21:
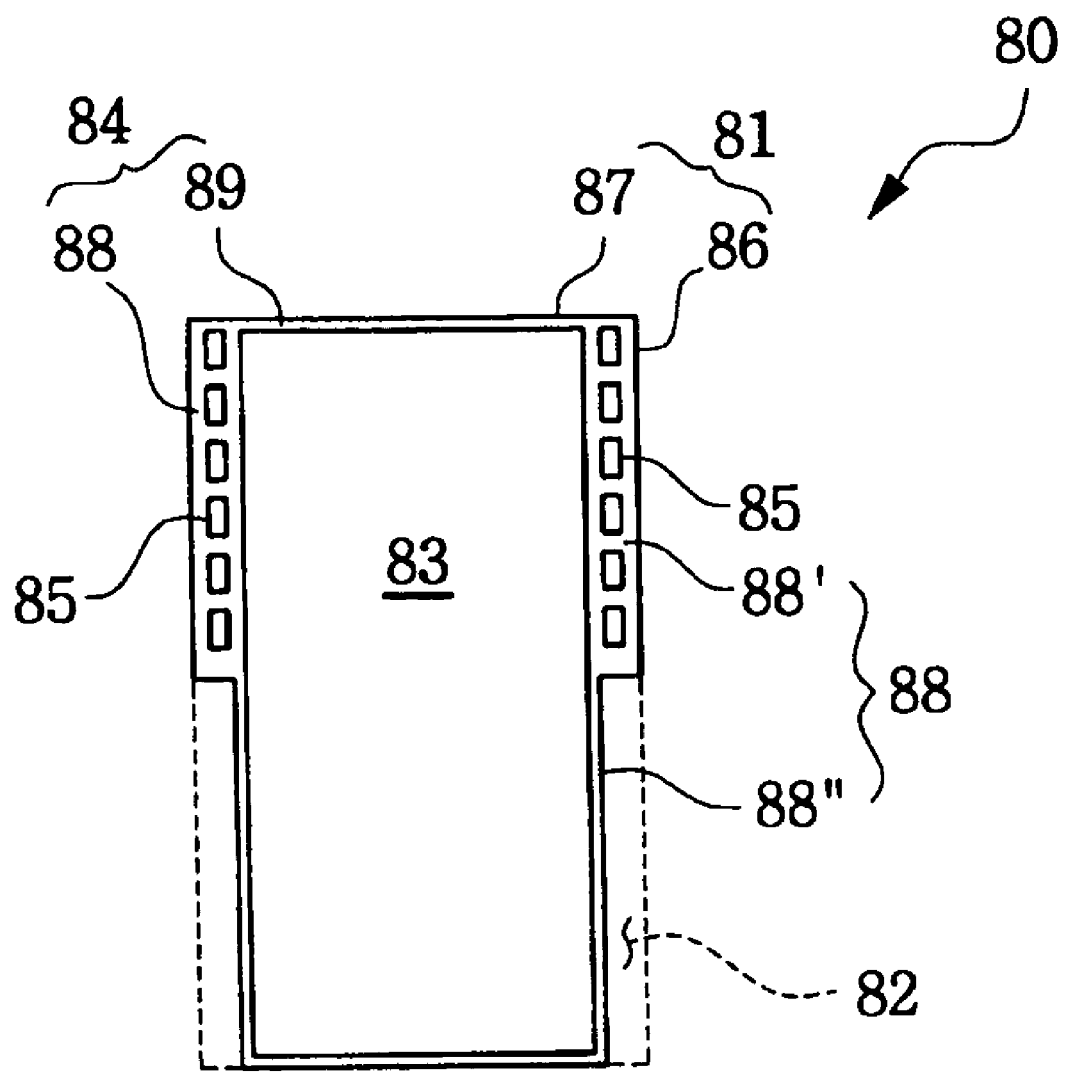

FIG. 21 illustrates an exemplary embodiment of the IC chips illustrated in FIGS. 20A and 20B after separation to obtain an individual IC chip 80. As suggested in FIGS. 20A and 20B, the IC chip 80 may include two recessed regions 82 on opposite sides at a first end of the chip and standard or full width regions 88 having a surface 86 on opposite sides of the chip at a second end of the chip. The full width regions 88, 88' having bond pads 85 and recessed regions 82 generally surround an internal functional or cell region 83 that includes the memory, logic and/or input/output circuitry necessary for the device to function properly. The end of the full width portion of the chip may be designated as including left 89 and right 87 portions that are incorporated in corners 84 and 81 respectively.

Figure 22:
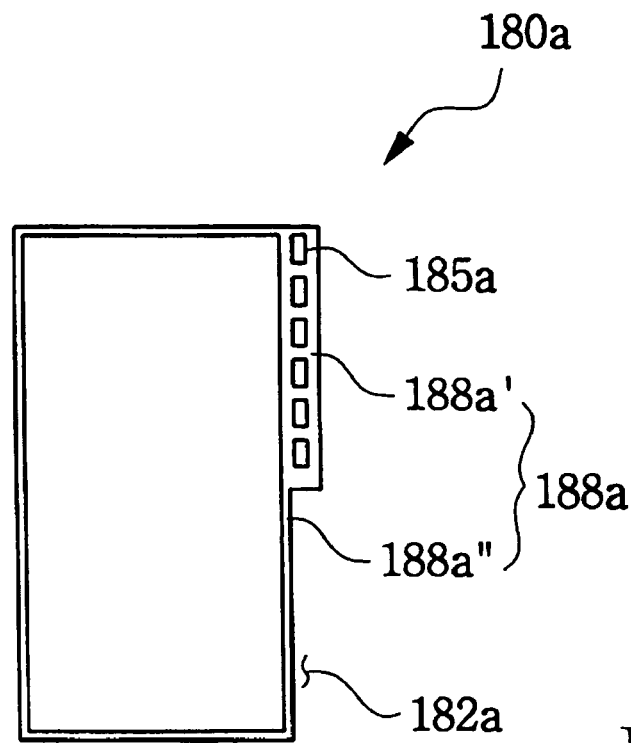
FIGS. 22 and 23 are plan views of an exemplary IC chip and an arrangement of exemplary IC chips according to the invention in a stacked chip arrangement.
Figure 23:
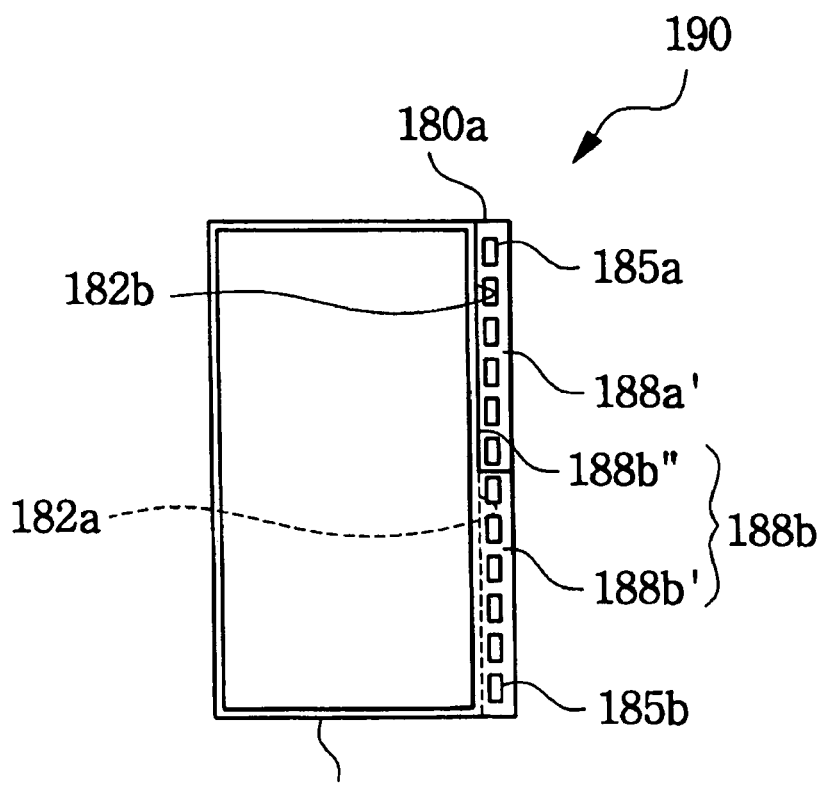

As illustrated in FIG. 22, another exemplary embodiment of a stepped or modified edge profile IC chip 180a according to the invention may include a single recessed region 182a having an edge 188a" adjacent a single full width region 188a' containing bond pads 185a that cooperate to form one side 188a of the IC chip. As illustrated in FIG. 23, an exemplary embodiment of a stacked multi-chip package 190 according to the invention can be formed by mounting modified edge profile IC chip 180a of FIG. 22 on a second modified edge profile IC chip 180b. As shown in FIG. 23, in this instance the recessed portion 188b" and the full width portion 188b' having bonding pads 185b of the second chip are reversed relative to those of IC chip 180a. Accordingly, when IC chip 180a is mounted on IC chip 180b, and vice versa, the recessed area of the upper chip will expose the bonding pads 185b of the lower chip, thereby providing a single accessible row of bond pads 185a, 185b for connecting the chips to a substrate.

Figure 24:
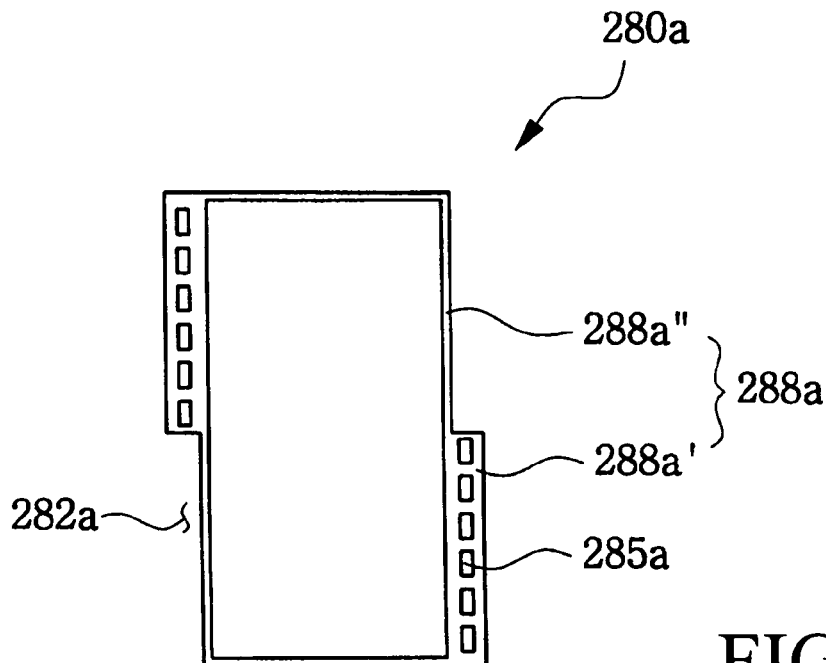
FIGS. 24 and 25 are plan views of an exemplary IC chip and an arrangement of exemplary IC chips according to the invention in a stacked chip arrangement.
Figure 25:
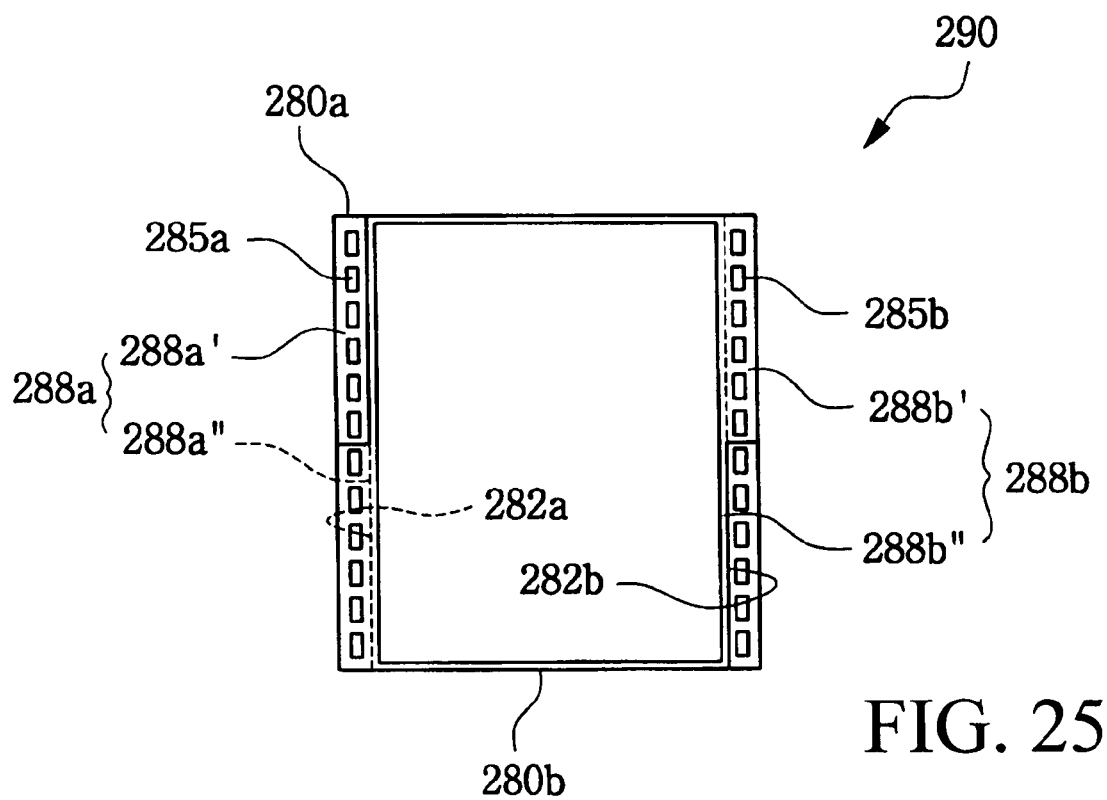

As illustrated in FIG. 24, another exemplary embodiment of a stepped or modified edge profile IC chip 280a according to the invention may include two recessed regions 282a having an edge 288a" adjacent an extended region 288a' containing bond pads 285a that cooperate to form opposite sides 288a of the IC chip. As illustrated in FIG. 25, an exemplary embodiment of a stacked multi-chip package 290 according to the invention can be formed by mounting modified edge profile IC chip 280a of FIG. 24 on a second modified edge profile IC chip 280b. As shown in FIG. 25, in this instance the recessed portions 288b" and the extended portions 288b' having bonding pads 285b of the second chip are reversed relative to those of IC chip 280a. Accordingly, when IC chip 280a is mounted on IC chip 280b, and vice versa, the recessed area of the upper chip will expose the bonding pads 285b of the lower chip, thereby providing accessible rows of bond pads 285a, 285b on opposite sides of the chip stack for connecting the chips to a substrate.

Figure 26:
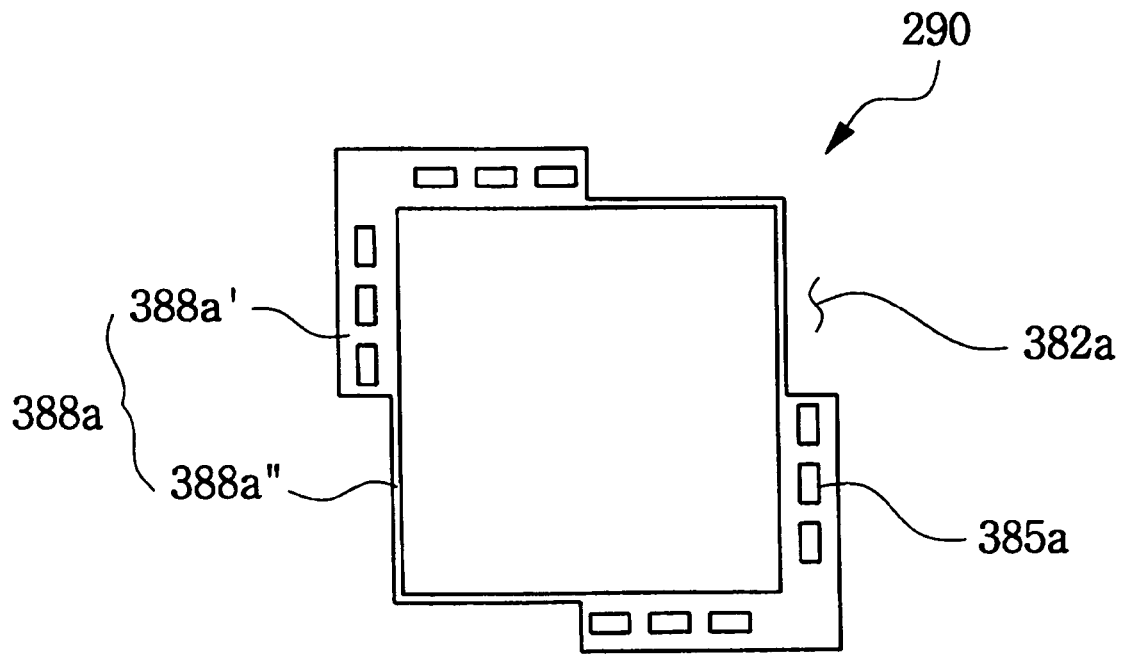
FIGS. 26 and 27 are, respectively, plan views of an exemplary IC chip according to the invention and a multi-chip stack package according to the invention incorporating such an IC chips.
Figure 27:
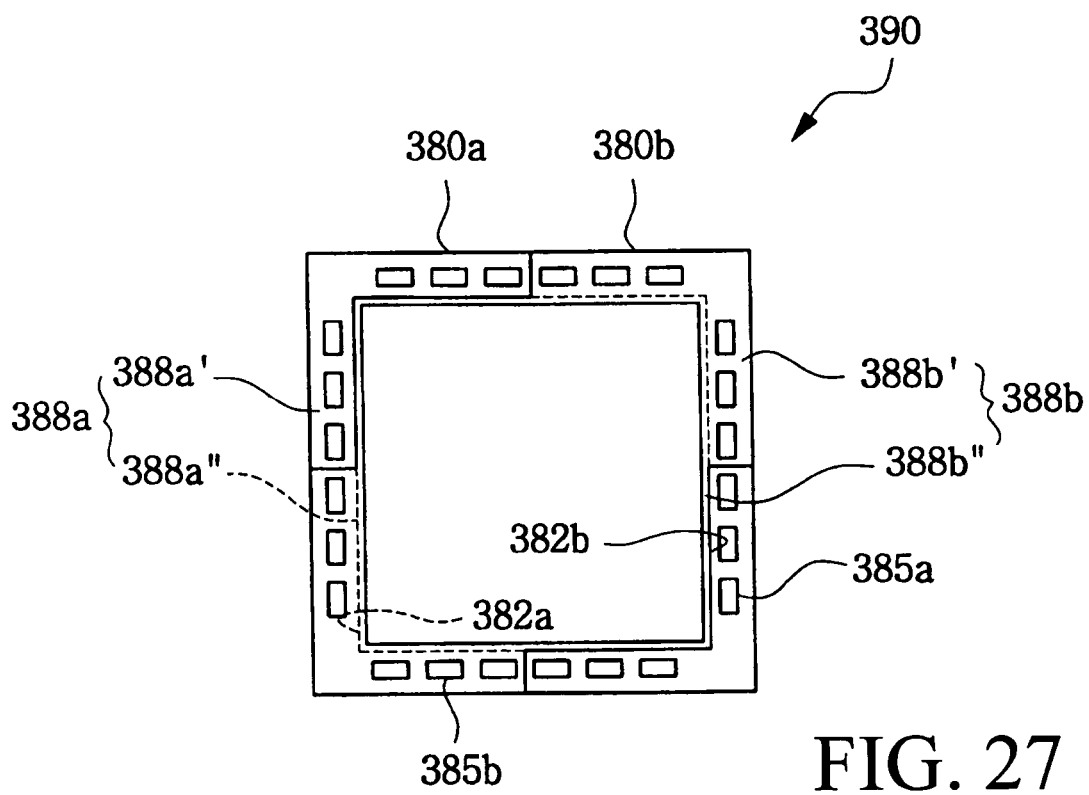

As illustrated in FIG. 26, another exemplary embodiment of a stepped or modified edge profile IC chip 290 according to the invention may include a pair of recessed corner regions 382a having edges 388a" adjacent extended edge regions 388a' containing bond pads 385a that cooperate to form opposite sides 388a of the IC chip. As illustrated in FIG. 27, an exemplary embodiment of a stacked multi-chip package 390 according to the invention can be formed by mounting a first modified edge profile IC chip 290 of FIG. 26 on a second modified edge profile IC chip 290, the two chips rotationally offset by 90°. As shown in FIG. 27, in this instance the recessed portions 388b" and the extended portions 388b' having bonding pads 385b of the second chip are shifted relative to those of the first IC chip. Accordingly, when the upper IC chip is mounted on the lower IC chip, the recessed areas of the upper chip will expose the bonding pads 385b of the lower chip, thereby providing an accessible row of bond pads 385a, 385b along each edge of the stacked chip structure or assembly for connecting the chips to a substrate.

Figure 28:
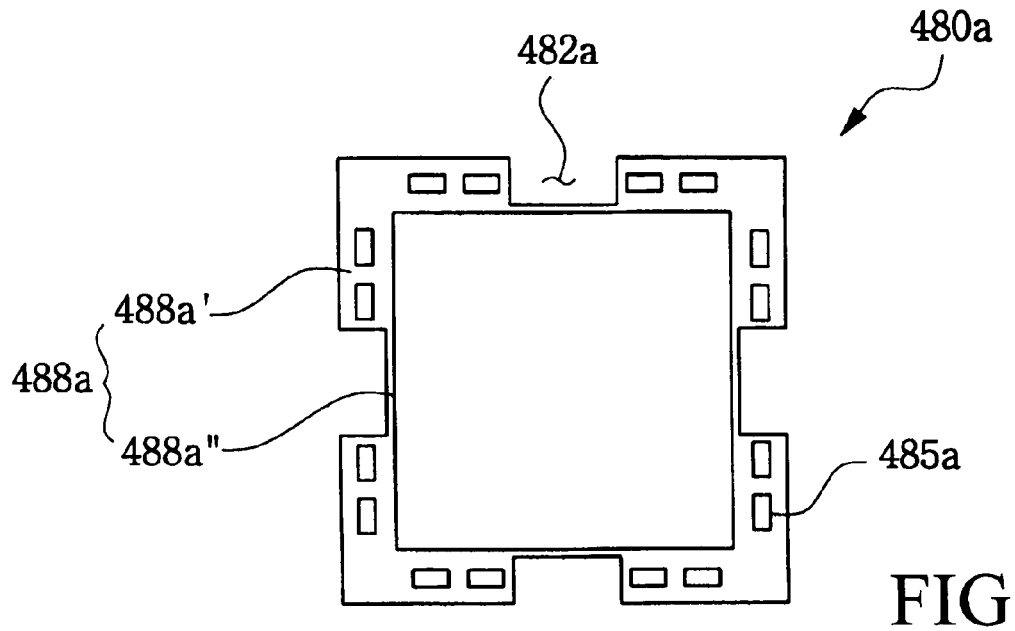
FIGS. 28 and 29 are, respectively, plan views of an exemplary IC chip according to the invention and a multi-chip stack package according to the invention incorporating such an IC chip.
Figure 29:
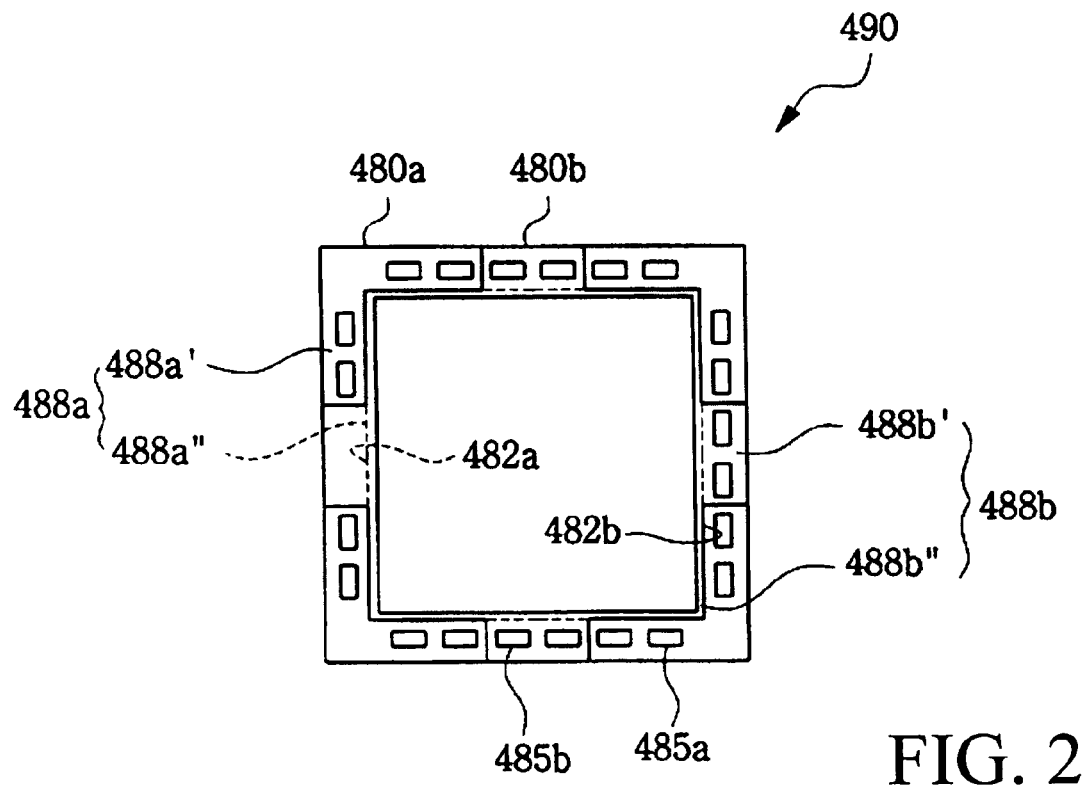

As illustrated in FIG. 28, another exemplary embodiment of a stepped or modified edge profile IC chip 480a according to the invention may include an intermediate recessed region 482a having an edge 488a" along each edge of the chip, the recessed regions being bracketed by adjacent extended regions 488a' containing bond pads 485a that cooperate to form each side 488a of the IC chip. As illustrated in FIG. 29, an exemplary embodiment of a stacked multi-chip package 490 according to the invention can be formed by mounting modified edge profile IC chip 480a of FIG. 28 on a second modified edge profile IC chip 480b that has been configured to provide a complementary combination of recessed 488b" and extended regions 488b' and bond pads 485b. As shown in FIG. 29, when such complementary IC chips are stacked, the additional bond pads 485b provided on the lower chip are exposed in one or more of the recessed regions 482a of the upper chip, thereby providing an accessible row of bond pads 485a, 485b along an edge of the stacked chip structure or assembly for connecting the chips to a substrate.

As illustrated in FIGS. 30-32 other stacked chip structures 590, 690, 790 may be assembled from a wide variety of stepped or modified edge profile IC chips having different sizes and/or edge profiles whereby bond pads provided on underlying or lower IC chips within the chip stack are exposed as the result of the sizing and positioning of the upper IC chip and/or are aligned with one or more corresponding recessed regions provided on the overlaying or upper IC chips, thereby exposing the bond pads of the lower IC chip(s) for bonding without the need for additional spacers or additional peripheral backside material removal.

In general, each of the exemplary IC chips will include a cell region in which logic and/or memory circuits are formed, and one or more peripheral regions in which input/output circuitry and/or (I/O) pads are formed. The recessed portion of the stepped edge profile chips may be provided adjacent a cell region and/or a peripheral region as desired. The IC chips and chip stack structures according to the invention may be connected to one or more substrates using an appropriate connection technique including wire bonding and/or flip chip attachment. In most instances, a resin encapsulant such as an epoxy molding compound (EMC) may be applied to protect the IC chips and, if present, the bonding wires and inner portions of the any leads incorporated in the package from contamination, corrosion and mechanical damage.

A range of substrates and connection techniques may be utilized in combination with the exemplary embodiments of the invention detailed above including wire bonding, flip chip bonding and/or tape automated bonding (TAB) in combination with an application-suitable substrates such as a lead frame, a printed circuit board (PCB), a flexible circuit board, or a ceramic substrate.

As suggested above, exemplary IC chips having modified edge profiles and/or bond pad arrangements may be utilized in combination with uncommonly configured substrates and/or packages. Such combinations may be utilized to improve the packing density on the substrate or secondary circuit board by more closely fitting the various components together and reducing the lost surface area. This improved packing density can be achieved at the device level for multi-chip packages and in higher level assemblies such as motherboards and module boards, on which modified edge profile packages can be mounted. Further, by improving the mounting density of the packages at the board level, the size of the board may also be reduced.

The aforementioned, specific stepped or modified edge profile IC chips and multi-chip assemblies, whether substantially planar or stacked, are presented by way of illustration only, and should not be construed as limiting the scope of the invention. Indeed, it will be appreciated by those of ordinary skill in the art that many suitable, alternative chip stacks may be configured and implemented by applying the teachings provided above.

While this invention has been particularly shown and described with reference to several exemplary embodiments thereof, it will be understood by those skilled in the art that various changes in form and details may be made therein without departing from the spirit and scope of the invention as defined by the appended claims.

What is claimed is:

1. A chip package comprising:
   a chip having:
      a nominal width $W_0$;
      a nominal length $L_0$;
      a first recessed region $R_1$ having a first recess depth $D_{r1a}$ and a first recess length $L_{r1a}$; and
   a substrate providing a mounting surface for the chip having a recessed region generally corresponding in shape to the recessed region of the chip.

2. A chip package comprising:
   a first chip having:
      a nominal width $W_0$;
      a nominal length $L_0$;
      a first recessed region $R_1$ having a first recess depth $D_{r1a}$ and a first recess length $L_{r1a}$;
   a second chip located adjacent to the first chip a substrate providing a mounting surface for the first chip having a recessed region generally corresponding in shape to the recessed region of the first chip; and
   bonding wires connected to bond pads located on either the first or second chip, the bonding wires located at least in part in the first recessed region of the first chip, wherein the first and second chips are stacked on top of each other.

3. The chip package of claim 2, further comprising bond pads on the first chip and bonding wires connected to the bond pads on the first chip, and at least a part of the bonding wires located on the first chip are located in a recessed region of the second chip.

4. The chip package of claim 3, further comprising a third chip stacked on a side of the second chip opposite a side on which the first chip is mounted, wherein the third chip has the same general shape as the first chip.

5. The chip package of claim 2, wherein the first and second chips have the same general shape having similar recessed regions.

6. The chip package of claim 5, wherein the first and second chip are stacked on top of each other and oriented with respect to each other to not have their respective recessed regions be located on top of each other but are rather offset from each other.

* * * * *